United States Patent
McGowan et al.

(10) Patent No.: US 10,622,983 B2
(45) Date of Patent: Apr. 14, 2020

(54) APPARATUS AND METHOD FOR COMPARING INPUT CURRENT TO SET OF CURRENT THRESHOLDS

(71) Applicant: QUALCOMM Incorporated, San Diego, CA (US)

(72) Inventors: Michael McGowan, Mesa, AZ (US); Iulian Mirea, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/251,997

(22) Filed: Jan. 18, 2019

(65) Prior Publication Data

US 2020/0052682 A1 Feb. 13, 2020

Related U.S. Application Data

(60) Provisional application No. 62/717,285, filed on Aug. 10, 2018.

(51) Int. Cl.
*H03K 5/22* (2006.01)
*H03K 5/24* (2006.01)
*G01R 19/165* (2006.01)

(52) U.S. Cl.
CPC ..... *H03K 5/2472* (2013.01); *G01R 19/16519* (2013.01)

(58) Field of Classification Search
CPC .............. H01L 2924/00; H02M 3/156; H02M 3/33507; H02M 2001/0009
See application file for complete search history.

(56) References Cited

U.S. PATENT DOCUMENTS

| 3,541,446 | A | 11/1970 | Prozeller et al. |
| 2004/0124910 | A1* | 7/2004 | Chuang ................ H03L 7/0895 327/541 |
| 2018/0175876 | A1 | 6/2018 | Chang et al. |
| 2018/0224876 | A1* | 8/2018 | Ogura ....................... G05F 1/59 |

OTHER PUBLICATIONS

International Search Report and Written Opinion—PCT/US2019/042834—ISA/EPO—Oct. 11, 2019.

\* cited by examiner

*Primary Examiner* — Sibin Chen
(74) *Attorney, Agent, or Firm* — Loza & Loza, LLP/Qualcomm (57) ABSTRACT

A current comparator including a first comparator configured to generate a first output signal based on a comparison of a first current to at least a second current; a second comparator configured to generate a second output signal based on a comparison of the first current to at least a third current; and a circuit configured to: direct the first current to the first comparator to perform the comparison of the first current to the at least the second current while blocking the first current from being applied to the second comparator; or direct the first current to the second comparator to perform the comparison of the first current to the at least the third current while blocking the first current from being applied to the first comparator.

18 Claims, 6 Drawing Sheets

| cmp_h | cmp_m | cmp_l | etdrv<1> | etdrv<0> | VSW |
|---|---|---|---|---|---|
| 0 | 0 | 0 | 0 | 0 | 0V |
| 0 | 0 | 1 | 0 | NC | 0V or VBAT |
| 0 | 1 | 1 | NC | 1 | VBAT or VAUX |
| 1 | 1 | 1 | 1 | 1 | VAUX |

FIG. 4C

| etdrv<1> | etdrv<0> | VSW |
|---|---|---|
| 0 | 0 | 0V |
| 0 | 1 | VBAT |
| 1 | 1 | VAUX |

APPARATUS AND METHOD FOR COMPARING INPUT CURRENT TO SET OF CURRENT THRESHOLDS

CROSS-REFERENCE TO RELATED APPLICATION

This application claims the benefit of the filing date of U.S. Provisional Application, Ser. No. 62/717,285, filed on Aug. 10, 2018, which is incorporated herein by reference.

FIELD

Aspects of the present disclosure relate generally to current comparators, and in particular, to an apparatus and method for comparing an input current to a set of current thresholds.

BACKGROUND

A current comparator may be used to generate an output signal based on a comparison of an input current to a set of current thresholds. For example, if the input current is lower than all of the set of current thresholds, the current comparator generates an output signal with a particular value. If the input current is higher than all of the set of current thresholds, the current comparator generates the output signal with another particular value. In a similar manner, if the input current is lower than some of the set of current thresholds, but higher than other of the set of current thresholds, the current comparator generates the output signal with yet another particular value. The output signal of a current comparator may be used to control one or more other components.

As with many devices, the accuracy of the comparison performed by a current comparator is of concern to designers. Additionally, the component count and power consumption of a current comparator is another concern for designers.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first comparator having a first input to receive an input signal, a second input to receive a reference signal, and an output; and a set of one or more switches having an input coupled to the output of the first comparator, wherein the set of one or more switches operate in response to an output signal from the first comparator to select a threshold current out of a set of one or more threshold currents to compare against the input signal.

Another aspect of the disclosure relates to an apparatus including a first comparator having a first input to receive an input signal, a second input to receive a reference signal, and an output; a current source to provide a first threshold current; a first current sink to provide a second threshold current; a second current sink to provide a third threshold current; and a set of one or more switches coupled between the current source and the first and the second current sinks, the set of one or more switches having an input coupled to the output of the first comparator.

Another aspect of the disclosure relates to an apparatus including a current source, a first switching device, a second switching device, and a first current sink, wherein the current source, the first switching device, the second switching device, and the first current sink are coupled in series between first and second voltage rails. The apparatus further includes a first comparator including a first input coupled to a node between the current source and the first switching device, and a second input to receive a reference signal; a second comparator including a first input coupled to a node between the second switching device and the first current sink, and a second input to receive the reference signal; and a third comparator including a first input to receive an input signal and coupled to a node between the first and second switching devices, a second input to receive the reference signal, and an output coupled to control inputs of the first and second switching devices.

Another aspect of the disclosure relates to an apparatus including a first comparator configured to generate a first output signal based on a comparison of a first current to at least a second current; a second comparator configured to generate a second output signal based on a comparison of the first current to at least a third current; and a circuit configured to: direct the first current to the first comparator to perform the comparison of the first current to the at least the second current while blocking the first current from being applied to the second comparator, or direct the first current to the second comparator to perform the comparison of the first current to the at least the third current while blocking the first current from being applied to the first comparator.

Another aspect of the disclosure relates to a method including generating a first output signal based on a comparison of a first current to at least a second current; generating a second output signal based on a comparison of the first current to at least a third current; and enabling the comparison of the first current to the at least the second current while disabling the comparison of the first current to the at least the third current; or enabling the comparison of the first current to the at least the third current while disabling the comparison of the first current to the at least the second current.

Another aspect of the disclosure relates to an apparatus including means for generating a first output signal based on a comparison of a first current to at least a second current; means for generating a second output signal based on a comparison of the first current to at least a third current; and means for enabling the means for comparing of the first current to the at least the second current while disabling the means for comparing the first current to the at least the third current; or means for enabling the means for comparing the first current to the at least the third current while disabling the means for comparing the first current to the at least the second current.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
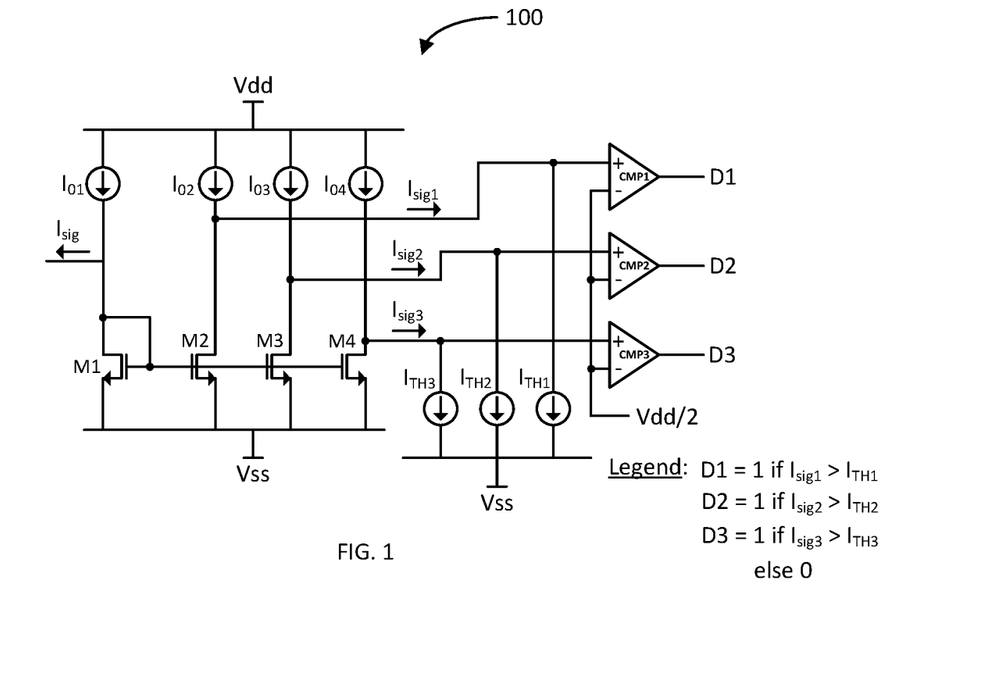
FIG. 1 illustrates a schematic diagram of an exemplary current comparator in accordance with an aspect of the disclosure.

FIG. 1 illustrates a schematic diagram of an exemplary current comparator 100 in accordance with an aspect of the disclosure. The current comparator 100 receives an input current signal $I_{sig}$, compares the input current signal $I_{sig}$ with a set of current thresholds $I_{TH1}$-$I_{TH3}$, and generates a set of output signals D3-D1 based on the comparison.

As an example, if the input current signal $I_{sig}$ is lower than all of the set of current thresholds $I_{TH1}$-$I_{TH3}$, the output signals D3-D1 may have a value of 000. If the input current signal $I_{sig}$ is higher than current threshold $I_{TH1}$ but lower than current thresholds $I_{TH2}$-$I_{TH3}$, the output signals D3-D1 may have a value of 001. If the input current signal $I_{sig}$ is higher than current thresholds $I_{TH1}$-$I_{TH2}$, but lower than current threshold $I_{TH3}$, the output signals D3-D1 may have a value of 011. And, if the input current signal $I_{sig}$ is higher than all of the set of current thresholds $I_{TH1}$-$I_{TH3}$, the output signals D3-D1 may have a value of 111.

In particular, the current comparator 100 includes a first current path between an upper voltage rail Vdd and a lower voltage rail Vss (e.g., ground). The first current path includes a first current source $I_{o1}$ coupled in series with a first transistor M1, which may be configured as an n-channel metal oxide semiconductor field effect transistor (NMOS FET). A current source, such as the first current source $I_{o1}$ and other current sources described herein, provides a substantially constant current, and may include a transistor, such as a p-channel metal oxide semiconductor field effect transistor (PMOS FET), with a control terminal (e.g., gate) biased with a substantially constant voltage. The drain and gate of the first transistor M1 are electrically coupled together to form a current mirror with other current paths described herein. An input current signal $I_{sig}$ is applied to a node between the first current source $I_{o1}$ and the first transistor M1.

The current comparator 100 further includes a second current path between the upper and lower voltage rails Vdd and Vss. The second current path includes a second current source $I_{o2}$ coupled in series with a second transistor M2, which may also be configured as an NMOS FET. The gate of transistor M2 is electrically coupled to the gate and drain of transistor M1 to form a current mirror relationship between the first current path and the second current path.

Similarly, the current comparator 100 further includes a third current path between the upper and lower voltage rails Vdd and Vss. The third current path includes a third current source $I_{o3}$ coupled in series with a third transistor M3, which may also be configured as an NMOS FET. The gate of transistor M3 is electrically coupled to the gate and drain of transistor M1 to form a current mirror relationship between the first current path and the third current path.

In a like manner, the current comparator 100 further includes a fourth current path between the upper and lower voltage rails Vdd and Vss. The fourth current path includes a fourth current source $I_{o4}$ coupled in series with a fourth transistor M4, which may also be configured as an NMOS FET. The gate of transistor M4 is electrically coupled to the gate and drain of transistor M1 to form a current mirror relationship between the first current path and the fourth current path.

The current comparator 100 further includes a set of threshold current sinks $I_{TH1}$-$I_{TH3}$. A current sink, such as the current sinks $I_{TH1}$-$I_{TH3}$ and other current sinks described herein, sinks a substantially constant current, and may include a transistor, such as an NMOS FET, with a control terminal (e.g., gate) biased with a substantially constant voltage. The first threshold current sink $I_{TH1}$ of the set is coupled between the node between the second current source $I_{o2}$ and the second transistor $M_2$ of the second current path, and the lower voltage rail Vss. The second threshold current sink $I_{TH2}$ of the set is coupled between the node between the third current source $I_{o3}$ and the third transistor $M_3$ of the third current path, and the lower voltage rail Vss. And, the third threshold current sink $I_{TH3}$ of the set is coupled between the node between the fourth current source $I_{o4}$ and the fourth transistor $M_4$ of the fourth current path, and the lower voltage rail Vss. In this example, the third threshold current sink $I_{TH3}$ sinks higher current than the second threshold current sink $I_{TH2}$, and the second threshold current sink $I_{TH2}$ sinks higher current than the first threshold current sink $I_{TH1}$ (e.g., $I_{TH3}$>$I_{TH2}$>$I_{TH1}$).

The current comparator 100 additionally includes a set of comparators CMP1-CMP3. The first comparator CMP1 includes a positive input terminal coupled to the node between the second current source $I_{o2}$ and the second transistor $M_2$ of the second current path. The second comparator CMP2 includes a positive input terminal coupled to the node between the third current source $I_{o3}$ and the third transistor $M_3$ of the third current path. The third comparator CMP3 includes a positive input terminal coupled to the node between the fourth current source $I_{O4}$ and the fourth transistor $M_4$ of the fourth current path. The set of comparators CMP1-CMP3 each include a negative input terminal configured to receive a threshold voltage, which may be set to Vdd/2. The set of comparators CMP1-CMP3 include outputs configured to generate the bits of the output signals D1-D3, respectively.

The current sources $I_{O1}$, $I_{O2}$, $I_{O3}$, and $I_{O4}$ of the first, second, third, and fourth current paths are configured to generate substantially the same current. Similarly, the transistors M1, M2, M3, and M4 of the first, second, third, and fourth current paths are configured to have substantially the same size (e.g., substantially the same channel width W and channel length L). As a result, and because of the current mirror relationship between the first current path and the second, third, and fourth current paths, the second, third, and fourth current paths are configured to generate replica currents $I_{sig1}$, $I_{sig2}$, and $I_{sig3}$ being substantially identical to the input current signal $I_{sig}$, respectively.

The positive terminals of the comparators have very high impedance; and thus, substantially all of the replica currents flow into the threshold current sinks $I_{TH1}$-$I_{TH3}$, respectively. If the replica current is lower than the corresponding threshold current, then the voltage on the corresponding positive terminal of the corresponding comparator is at substantially Vss (the voltage at the lower voltage rail). Conversely, if the replica current is higher than the corresponding threshold current, then the voltage on the corresponding positive terminal of the corresponding comparator is at substantially Vdd (the voltage at the upper voltage rail). As discussed above, the current sinks are configured such that current threshold $I_{TH3}$ is greater than current threshold $I_{TH2}$, which, in turn, is greater than current threshold $I_{TH1}$.

The reason the voltage at the positive terminal of the corresponding comparator is at Vss when the replica current is below the corresponding threshold current, and at Vdd when the replica current is above the corresponding threshold current is as follows: If the replica current is above the corresponding threshold current (e.g., $I_{sig1}$-$I_{TH1}$>0), then the excess current flows through an equivalent resistance being the internal resistances of the corresponding current sources/sinks ($I_{O2}$, $M_2$, and $I_{TH1}$) connected in parallel. As the equivalent resistance of the current sources/sinks is relatively high, a small amount of excess current flowing through these devices causes the voltage at the positive terminal of the corresponding comparator (e.g., CMP1) to rise to substantially the rail voltage Vdd. If, on the other hand, the replica current is below the corresponding threshold current (e.g., $I_{sig1}$-$I_{TH1}$<0), there is no excess current to flow through the internal resistances of the current sources/sinks ($I_{O2}$, $M_2$, and $I_{TH1}$). Thus, the voltage at the positive terminal of the corresponding comparator (e.g., CMP1) is at substantially Vss.

Thus, if the input current signal $I_{sig}$ is lower than all of the current thresholds $I_{TH1}$-$I_{TH3}$, then the voltages at the corresponding positive terminals of the comparators CMP1-CMP3 are at substantially Vss, which is less than the threshold voltage Vdd/2 applied to the negative terminals of the comparators. Thus, the comparators CMP1-CMP3 generate the output signals D3-D1 as 000.

If the input current signal $I_{sig}$ is higher than the first current threshold $I_{TH1}$, but lower than current thresholds $I_{TH2}$ and $I_{TH3}$, the voltage at the positive terminal of comparator CMP1 is at substantially Vdd and the voltages at the positive terminals of comparators CMP2 and CMP3 are at substantially Vss. Thus, comparator CMP1 outputs D1 as a logic one (1) and comparators CMP2-CMP3 output D2-D3 as logic zeros (00). Accordingly, the output signals D3-D1 have a value of 001.

If the input current signal $I_{sig}$ is higher than the first and second current thresholds $I_{TH1}$ and $I_{TH2}$, but lower than the third current threshold $I_{TH3}$, the voltages at the positive terminals of comparators CMP1-CMP2 are at substantially Vdd and the voltage at the positive terminal of comparator CMP3 is at substantially Vss. Thus, comparators CMP1-CMP2 output D1-D2 as 11 and comparator CMP3 outputs D3 as 0. Accordingly, the output signals have a value of 011.

Similarly, if the input current signal $I_{sig}$ is higher than all of the current thresholds $I_{TH1}$-$I_{TH3}$, the voltages at the positive terminals of comparators CMP1-CMP3 are at substantially Vdd, which are all higher than the threshold voltage Vdd/2 applied to the negative terminal of the comparators. Thus, comparators CMP3-CMP1 generate the output signals D3-D1 with a value of 111.

There are several drawbacks with the current comparator 100. First, due to process variation, the current sources $I_{O1}$ to $I_{O4}$ do not generate substantially the same current and there are mismatches between the transistors M1 to M4. As a result, the replica currents $I_{sig1}$ to $I_{sig3}$ generated by the second, third, and fourth current paths may not be substantially the same as the input current signal $I_{sig}$. Because there may be errors in generating the replica currents $I_{sig1}$ to $I_{sig3}$, the comparison made by the comparators CMP1-CMP3 may also be subject to errors. Thus, the output signals D3-D1 may not be as accurate as desired.

Second, the current paths for generating the replica currents $I_{sig1}$ to $I_{sig3}$ require significant number of components (e.g., current sources $I_{O2}$-$I_{O4}$ and transistors M2-M4). This significantly increases the component count of the current comparator 100; and thus, the integrated circuit footprint to implement the current comparator 100 may be undesirably large. Furthermore, because of the significant number of components, the current comparator 100 consumes significant power. Thus, there is a need to improve the accuracy, reduce the number of components, and reduce the power consumption of current comparators.

Figure 2:
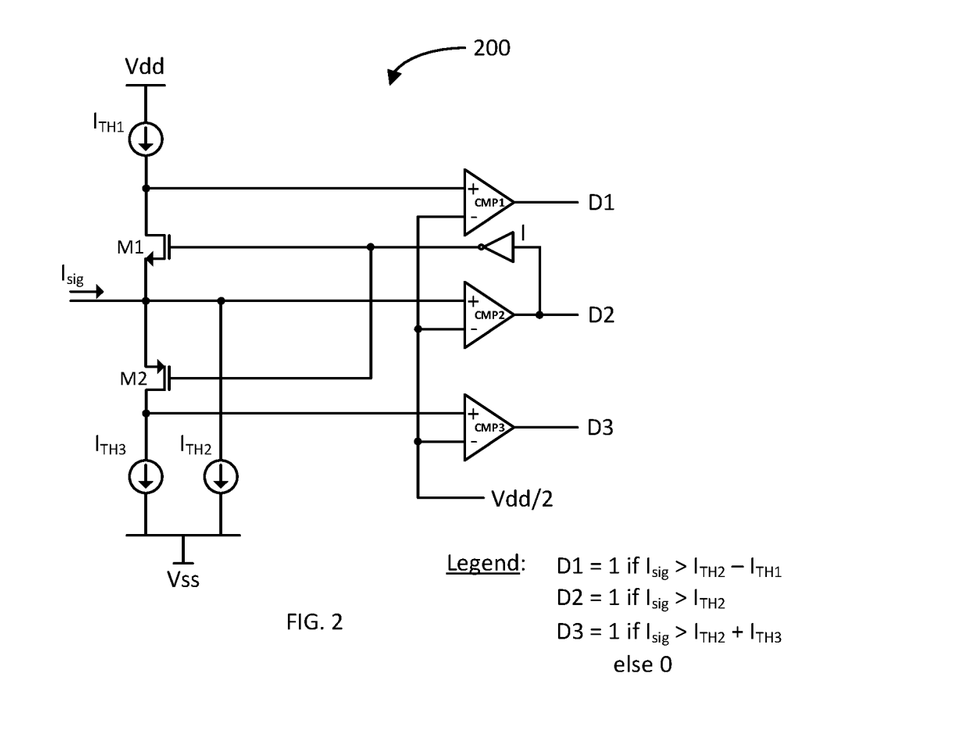
FIG. 2 illustrates a schematic diagram of another exemplary current comparator in accordance with another aspect of the disclosure.

FIG. 2 illustrates a schematic diagram of another exemplary current comparator 200 in accordance with another aspect of the disclosure. In summary, the current comparator 200 performs essentially the same operation as the current comparator 100 (e.g., compares an input current signal $I_{sig}$ to three current thresholds $I_{TH1}$-$I_{TH3}$, and generates an output signal based on the comparison). However, the current comparator 200 only uses a single current path as compared to three currents paths used in current comparator 100; and therefore, it is less prone to errors in generating the output signal due to replica current mismatches that may be present in current comparator 100. Additionally, because there is only a single current path in current comparator 200, the current comparator 200 requires less components and consumes less power.

In particular, the current comparator 200 includes a threshold current source $I_{TH1}$ coupled in series with a first transistor M1 (e.g., an NMOS FET), a second transistor M2 (e.g., a p-channel MOSFET or PMOS FET), and a threshold current sink $I_{TH3}$, between an upper voltage rail Vdd and a lower voltage rail Vss. The current comparator 200 further includes another threshold current sink $I_{TH2}$ coupled between an input node (situated between the first and second transistors M1-M2) and the lower voltage rail Vss. Similar to current comparator 100, the threshold current sink $I_{TH3}$ sinks greater current than that of threshold current sink $I_{TH2}$, and the current source $I_{TH1}$ sources less current than the current sinking of threshold current sinks $I_{TH2}$ and $I_{TH3}$ (e.g., $I_{TH3}$>$I_{TH2}$>$I_{TH1}$). An input current signal $I_{sig}$ is applied to the input node between the first and second transistors M1 and M2. Although, in FIG. 2, the input current $I_{sig}$ is shown flowing into the current comparator 200, it shall be understood that the input current $I_{sig}$ may flow into and/or out of the current comparator 200.

The current comparator 200 further includes a set of comparators CMP1-CMP3. The comparators CMP1-CMP3 each include a negative input terminal configured to receive a threshold voltage, which may be set to Vdd/2. The positive terminal of the comparator CMP1 is coupled to a node between the threshold current source $I_{TH1}$ and the first transistor M1. The positive terminal of the comparator CMP2 is coupled to the input node between the first and second transistors M1 and M2. The positive terminal of the comparator CMP3 is coupled to a node between the second transistor M2 and the threshold current sink $I_{TH3}$. The comparators CMP3-CMP1 are configured to generate bits of output signals D3-D1, respectively.

Additionally, the current comparator 200 includes an inverter I with an input coupled to the output of the second comparator CMP2. The inverter I includes an output coupled to the gates of the first and second transistors M1 and M2.

In operation, if the current signal $I_{sig}$ is lower than the second threshold current $I_{TH2}$, then the voltage at the positive input terminal of the second comparator CMP2 is at substantially Vss, which is lower than the threshold voltage Vdd/2 applied to the negative input terminal of the second comparator CMP2. Thus, the second comparator CMP2 outputs D2 as a "0" or a low logic voltage (e.g., at substantially Vss). The inverter I inverts the "0" and generates a "1" or a high logic voltage (e.g., at substantially Vdd). The high logic voltage generated by the inverter I and applied to the gates of transistors M1 and M2 causes transistor M1 to turn on and transistor M2 to turn off.

Figure 3A:
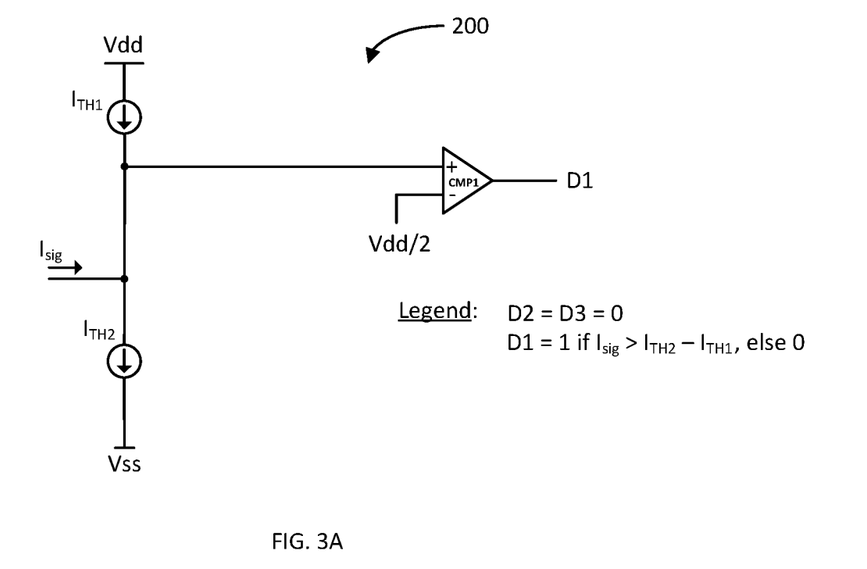
FIGS. 3A-3B illustrate schematic diagrams of exemplary equivalent circuits of the current comparator of FIG. 2 based on different comparison results in accordance with another aspect of the disclosure.

FIG. 3A illustrates a schematic diagram of an exemplary equivalent circuit of the current comparator 200 when the input current signal $I_{sig}$ is lower than the second current threshold $I_{TH2}$. As transistor M2 is turned off, the transistor M2, the threshold current sink $I_{TH3}$, and the third comparator CMP3 are effectively disabled; and thus, these devices may be removed from the equivalent circuit. Additionally, since transistor M1 is turned on, it can be represented in the equivalent circuit as short directly coupling the threshold current source $I_{TH1}$ to the threshold current sink $I_{TH2}$. As the states of the outputs of comparator CMP2 and the inverter I are known, these devices may also be removed from the equivalent circuit.

Thus, the equivalent circuit includes the threshold current source $I_{TH1}$ coupled in series with the threshold current sink $I_{TH2}$ between the upper voltage rail Vdd and the lower voltage rail Vss. The input signal $I_{sig}$ is applied to the input node between the threshold current source $I_{TH1}$ and the threshold current sink $I_{TH2}$. The positive input terminal of the first comparator CMP1 is coupled to the input node. The negative input terminal of the first comparator CMP1 receives the threshold voltage Vdd/2.

Thus, the first comparator CMP1 generates D1 as a logic one (1) if the following relationship applies:

$I_{sig}$-$I_{TH1}$>$I_{TH2}$ or $I_{sig}$>$I_{TH2}$-$I_{TH1}$

Else, the first comparator CMP1 generates D1 as a logic zero (0). Thus, when the input signal $I_{sig}$ is lower than the second current threshold $I_{TH2}$, the states D2 and D3 of the output signal are at logic zeros (0s), and the state D1 of the output signal depends on whether the input current signal $I_{sig}$ is greater than the difference between current thresholds $I_{TH2}$ and $I_{TH1}$.

If the current signal $I_{sig}$ is higher than the second threshold current $I_{TH2}$, then the voltage at the positive input terminal of the second comparator CMP2 is at substantially Vdd, which is higher than the threshold voltage Vdd/2 applied to the negative input terminal of the second comparator CMP2. Thus, the second comparator CMP2 outputs D2 as a "1" or a high logic voltage (e.g., at substantially Vdd). The inverter I inverts the "1" and generates a "0" or a low logic voltage (e.g., at substantially Vss). The low logic voltage generated by the inverter I and applied to the gates of transistors M1 and M2 causes transistor M1 to turn off and transistor M2 to turn on.

Figure 3B:
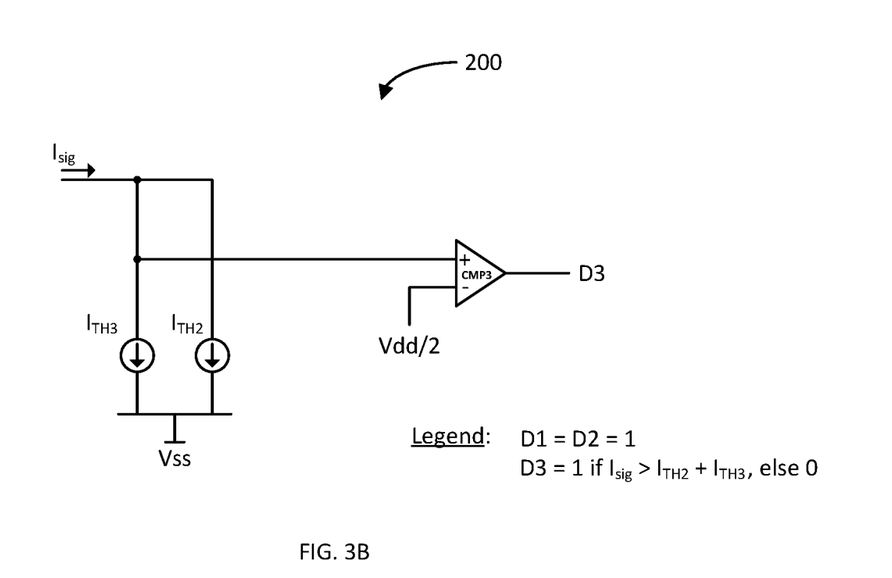

FIG. 3B illustrates a schematic diagram of an exemplary equivalent circuit of the current comparator 200 when the input current signal $I_{sig}$ is higher than the second current threshold $I_{TH2}$. As transistor M1 is turned off, the transistor M1, the threshold current source $I_{TH1}$, and the first comparator CMP1 are effectively disabled; and thus, these devices may be removed from the equivalent circuit. Additionally, since transistor M2 is turned on, it can be represented in the equivalent circuit as short directly coupling the input node to the threshold current sink $I_{TH3}$. As the states of the outputs of comparator CMP2 and the inverter I are known, these devices may also be removed from the equivalent circuit.

Thus, the equivalent circuit includes the threshold current sinks $I_{TH2}$ and $I_{TH3}$ coupled in parallel between the input node and the lower voltage rail Vss. The input signal $I_{sig}$ is applied to the input node. The positive input terminal of the third comparator CMP3 is coupled to the input node. The negative input terminal of the third comparator CMP3 receives the threshold voltage Vdd/2.

Thus, the third comparator CMP3 generates D3 as a logic one (1) if the following relationship applies:

$I_{sig}$>$I_{TH2}$-$I_{TH3}$

Else, the third comparator CMP3 generates D3 as a logic zero (0). Thus, when the input signal $I_{sig}$ is higher than the second current threshold $I_{TH2}$, the states D1 and D2 of the output signal are at logic ones (1s), and the state D3 of the output signal depends on whether the input current signal $I_{sig}$ is greater than the sum of the current thresholds $I_{TH2}$ and $I_{TH3}$.

Referring again to FIG. 2, the current comparator 200 redirects the input current $I_{sig}$ to the appropriate comparator CMP1 or CMP3 based on a comparison of the input current with the current threshold $I_{TH2}$. For example, if the input current $I_{sig}$ is determined to be lower than the second threshold current $I_{TH2}$, then the second comparator CMP2 via the inverter I and the first and second transistors M1 and M2 direct the input current to the first comparator CMP1 for comparison with the difference in the threshold currents $I_{TH2}$ and $I_{TH1}$ (while blocking the input current from being applied to the third comparator CMP3). Similarly, if the input current $I_{sig}$ is determined to be higher than the second threshold current $I_{TH2}$, then the second comparator CMP2 via the inverter I and the first and second transistors M1 and M2 direct the input current $I_{sig}$ to the third comparator CMP3 for comparison with the sum of the threshold currents $I_{TH2}$ and $I_{TH3}$ (while blocking the input current from being applied to the first comparator CMP1).

As can be seen, the current comparator 200 has a single current path that can be reconfigured based on the result of the comparison of the input current $I_{sig}$ with the second threshold current $I_{TH2}$. This results in a more accurate comparison since the input current need not be replicated, which as discussed can be prone to errors, and the input current $I_{sig}$ is directly used to perform the required comparison. Furthermore, as there is only a single current path, the current comparator 200 includes fewer components compared to current comparator 100. Accordingly, the current comparator 200 requires less integrated circuit footprint to implement, and consumes less power than current comparator 100.

Although in the above example, the input current is compared to three (3) thresholds, it shall be understood that a current comparator implementing the aforementioned concepts can be applicable to comparing the input current to more than three (3) thresholds.

Figure 4A:
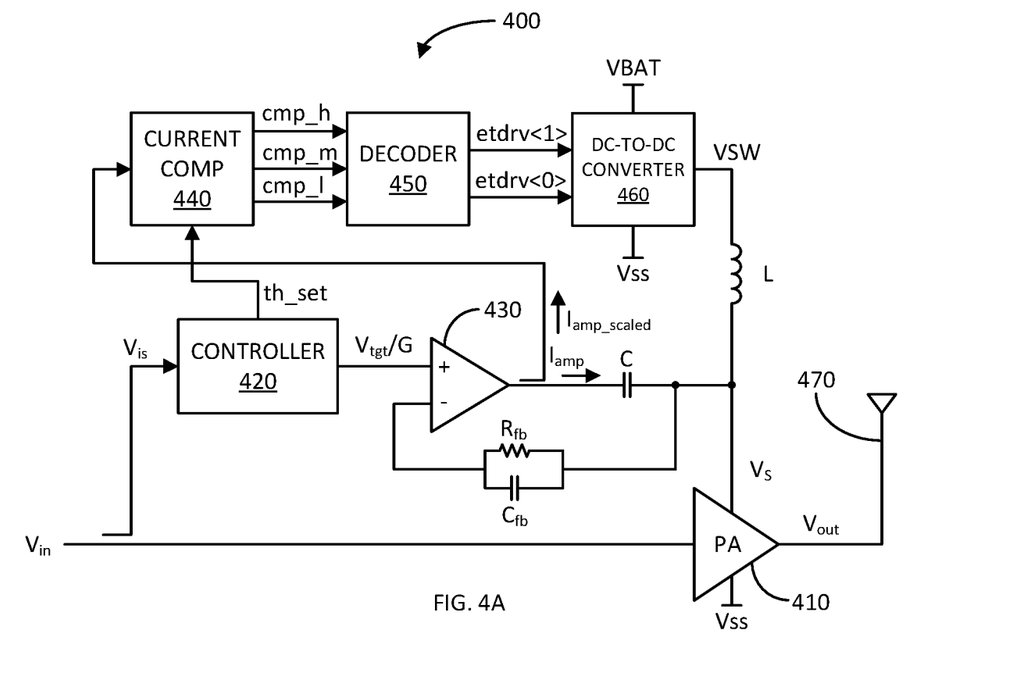
FIG. 4A illustrates a block diagram of an exemplary voltage control circuit in accordance with another aspect of the disclosure.

FIG. 4A illustrates a block diagram of an exemplary voltage control circuit 400 in accordance with another aspect of the disclosure. In this example, the voltage control circuit 400 is configured to control or regulate a supply voltage for a power amplifier (PA). However, it shall be understood that the voltage control circuit 400 may be configured to control or regulate any voltage at a particular node.

The current comparator 200 discussed above may be used in many applications, one of which is to control the supply voltage $V_S$ for a power amplifier (PA). More specifically, the current comparator 200 may be used to control the supply voltage $V_S$ for the PA such that the supply voltage $V_S$ substantially tracks the envelope of the input or output signal of the PA, or to vary the supply voltage $V_S$ in any desired manner.

In particular, the voltage control circuit 400 includes a power amplifier (PA) 410 (which generally can be any load), a controller 420, a linear amplifier 430 including an output capacitor C and a feedback network with a feedback resistor $R_{fb}$ coupled in parallel with a feedback capacitor $C_{fb}$, a current comparator 440, a decoder 450, a DC-to-DC converter 460 including an inductor L, and an antenna 470. In this example, the current comparator 440 may be configured similar to current comparator 200 but with some modification as described below.

An input voltage signal $V_{in}$ is applied to the input of the PA 410. The PA 410 is configured to amplify the input voltage signal $V_{in}$ to generate an output voltage signal $V_{out}$. The output voltage signal $V_{out}$ is applied to the antenna 470 for generating a wireless signal. The PA 410 is coupled between an upper voltage rail, which receives a variable supply voltage $V_S$, and a lower voltage rail Vss. The remaining components of the voltage control circuit 400 generate and control the supply voltage $V_S$ such that the supply voltage $V_S$ may substantially track the envelope of the input voltage signal $V_{in}$, or the envelope of the output voltage signal $V_{out}$ (e.g., if the gain of the PA is substantially constant), or vary in any desired manner. This variation of the supply voltage $V_S$ may be performed in a manner that improves the power efficiency operation of the PA 410.

For generating the supply voltage $V_S$ for the PA 410, a sample $V_{is}$ of the input voltage signal $V_{in}$ is provided to the controller 420 using, for example, a directional coupler. The controller 420 determines the envelope of the input voltage signal $V_{in}$ by processing the sampled signal $V_{is}$. The power controller 420 generates a control voltage $V_{tgt}/G$ based on the envelope of the input voltage signal $V_{in}$, and applies the control voltage $V_{tgt}/G$ to a positive input terminal of the linear amplifier 430, wherein $V_{tgt}$ is a target supply voltage for the supply voltage $V_S$ and G is the gain of the linear amplifier 430. The controller 420 also generates and sends a threshold control signal th_set to the current comparator 440 for setting its current thresholds, as discussed further herein. The linear amplifier 430 sources or sinks a current $I_{amp}$ based on a comparison of a feedback voltage at the negative input of the linear amplifier 430 to the control voltage $V_{tgt}/G$ to maintain the supply voltage $V_S$ for the PA 410 tracking the envelope of the input voltage signal $V_{in}$.

A sample $I_{amp\_scaled}$ of the current $I_{amp}$ is applied to the input of the current comparator 440. The sampled current $I_{amp\_scaled}$ may be generated from the current $I_{amp}$ via a current mirror, where the ratio of the sampled current $I_{amp\_scaled}$ to the current $I_{amp}$ is less than one (1) to reduce power consumption for the voltage control circuit 400. The current comparator 440 compares the sampled current $I_{amp\_scaled}$ to low and high current thresholds $I_{TH\_N}$ and $I_{TH\_P}$, and generates an output signal including bits cmp_h, cmp_m, and cpm_l. The low and high current thresholds $I_{TH\_N}$ and $I_{TH\_P}$ are programmable, being set by the threshold control signal th_set generated by the controller 420. The decoder 450 decodes the cmp_h, cmp_m, cpm_l bits from the output of the current comparator 440, and generates a control signal etdrv<1:0> for the DC-to-DC converter 460. The DC-to-DC converter 460, which may be configured as a Buck converter or switching mode power supply (SMPS) and generates most of the power for the PA 410, generates a voltage VSW based on the control signal etdrv<1:0> as discussed in more detail below.

Figure 4B:
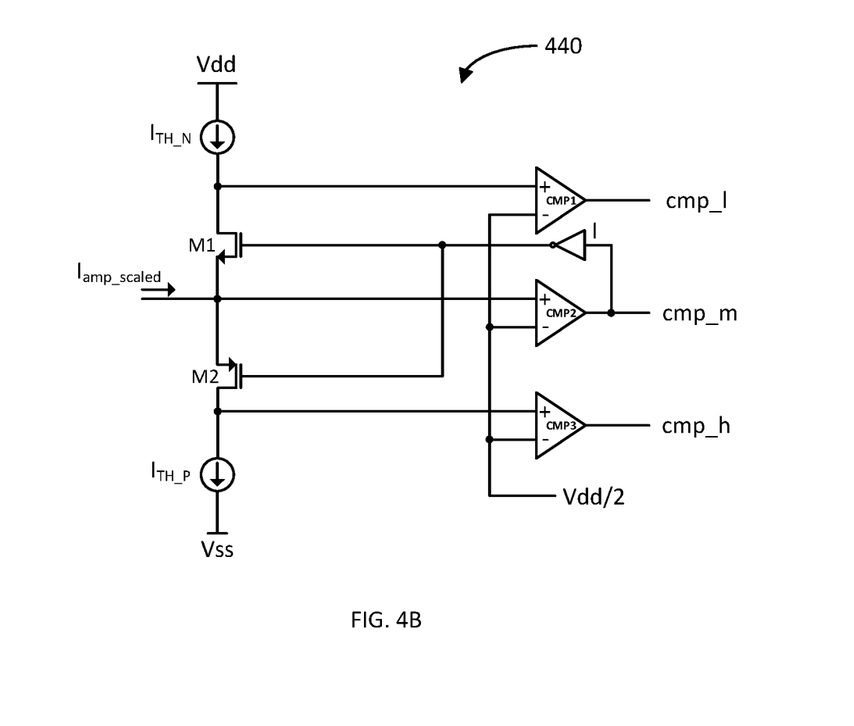
FIG. 4B illustrates a schematic diagram of yet another exemplary current comparator in accordance with another aspect of the disclosure.

FIG. 4B illustrates a schematic diagram of the current comparator 440 in accordance with another aspect of the disclosure. The current comparator 440 is similar to that of current comparator 200 with the exception that the threshold current sink $I_{TH2}$ is set to zero (0) current; or in practice, the threshold current sink $I_{TH2}$ does not exist in the current comparator 440. With the middle threshold current $I_{TH2}$ set to zero (0), the current comparator 440 compares the sampled amplifier current $I_{amp\_scaled}$ to a positive threshold current $I_{TH\_P}$ and a negative threshold current $I_{TH\_N}$.

In particular, the current comparator 440 includes a threshold current source $I_{TH\_N}$, a first transistor M1 (e.g., an NMOS FET), a second transistor M2 (e.g., a PMOS FET), and a threshold current sink $I_{TH\_P}$, all coupled in series between an upper voltage rail Vdd and a lower voltage rail Vss. The current comparator 440 further includes a set of comparators CMP1-CMP3, each including a negative input terminal configured to receive a threshold voltage, which may be set to Vdd/2.

The first comparator CMP1 includes a positive input terminal coupled to a node between the threshold current source $I_{TH\_N}$ and the first transistor M1. The second comparator CMP2 includes a positive input terminal coupled to an input node between the first and second transistors M1 and M2, the node at which the sampled amplifier current $I_{amp\_scaled}$ is applied. The third comparator CMP3 includes a positive input terminal coupled to a node between the second transistor M2 and the threshold current sink $I_{TH\_P}$. The first, second, and third comparators CMP1-CMP3 generate the bits cmp_l, cmp_m, and cmp_h of the output signal of the current comparator 440, respectively.

The current comparator 440 further includes an inverter I including an input coupled to the output of the second comparator CMP2, and an output coupled to the gates of transistors M1 and M2.

In operation, if the sampled amplifier current $I_{amp\_scaled}$ is negative (flows out of the current comparator 440), the second comparator CMP2 generates cmp_m as a logic zero (0) (e.g., at substantially Vss), which is applied to the input of the inverter I. The inverter I inverts the logic zero (0) to generate a logic one (1) (e.g., at substantially Vdd), which is applied to the gates of transistors M1 and M2. As a result, transistor M1 is turned on and transistor M2 is turned off. Thus, the comparison performed by the first comparator CMP1 is whether the sampled amplifier current $I_{amp\_scaled}$ is more negative than the current threshold $I_{TH\_N}$. If the sampled amplifier current $I_{amp\_scaled}$ is more negative than the current threshold $I_{TH\_N}$, the first comparator CMP1 generates cmp_l as a logic zero (0). If the sampled amplifier current $I_{amp\_scaled}$ is less negative than the current threshold $I_{TH\_N}$, the first comparator CMP1 generates cmp_l as a logic one (1).

If the sampled amplifier current $I_{amp\_scaled}$ is positive (flows into the current comparator 440), the second comparator CMP2 generates cmp_m as a logic one (1) (e.g., at substantially Vdd), which is applied to the input of the inverter I. The inverter I inverts the logic one (1) to generate a logic zero (0) (e.g., at substantially Vss), which is applied to the gates of transistors M1 and M2. As a result, transistor M1 is turned off and transistor M2 is turned on. Thus, the comparison performed by the third comparator CMP3 is whether the sampled amplifier current $I_{amp\_scaled}$ is more positive than the current threshold $I_{TH\_P}$. If the sampled amplifier current $I_{amp\_scaled}$ is less than the current threshold $I_{TH\_P}$, the third comparator CMP3 generates cmp_h as a logic zero (0). If the sampled amplifier current $I_{amp\_scaled}$ is greater than the current threshold $I_{TH\_P}$, the third comparator CMP3 generates cmp_h as a logic one (1).

Figure 4C:
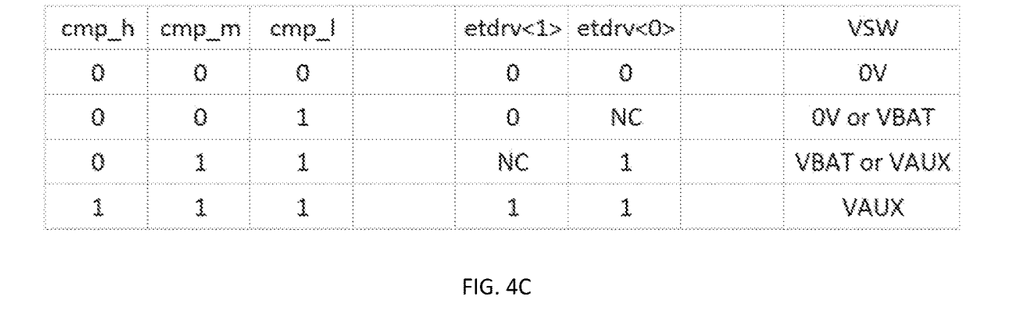
FIG. 4C illustrates a table mapping current comparator output to decoder output to DC-to-DC converter output voltage in accordance with another aspect of the disclosure.

FIG. 4C illustrates a table for mapping the output signal (cmp_h, cmp_m, cmp_l) of current comparator 440 to the output signal (etdrv<1> and etdrv<0>) of the decoder 450 to the output voltage VSW of the DC-to-DC converter 460 in accordance with another aspect of the disclosure.

As indicated, when the output signal (cmp_h, cmp_m, cmp_l) of the current comparator 440 is at 000, meaning that the amplifier 430 is sinking current beyond a sinking threshold (corresponding to $I_{TH\_N}$), the decoder 450 generates its output signal (etdrv<1:0>) as a 00 to instruct the DC-to-DC converter 460 to generate its output voltage VSW at zero (0) Volt. This occurs when the supply voltage $V_S$ is significantly above the target supply voltage $V_{tgt}$, and the linear amplifier 430 is sinking current beyond the sinking current threshold and the voltage VSW is at zero (0) Volt so that the current supplied to the PA 410 by the DC-to-DC converter 460 is decreasing, both actions working together to decrease the supply voltage $V_S$.

When the output signal (cmp_h, cmp_m, cmp_l) of the current comparator 440 changes state from 000 to 001, meaning that the amplifier 430 is sinking current but not beyond the sinking threshold and the sinking current is decreasing, the decoder 450 maintains its output signal (etdrv<1:0>) at 00 to continue instructing the DC-to-DC converter 460 to generate its output voltage VSW at zero (0) Volt. Again, this occurs when the supply voltage $V_S$ is above the target supply voltage $V_{tgt}$, and both the amplifier 430 and the DC-to-DC converter 460 are working together to further decrease the supply voltage $V_S$.

When the output signal (cmp_h, cmp_m, cmp_l) of the current comparator 440 changes state from 001 to 011, meaning that the amplifier 430 has stopped sinking current and is now sourcing current, the decoder 450 generates its output signal (etdrv<1:0>) as a 01 to instruct the DC-to-DC converter 460 to generate its output voltage VSW at substantially the battery voltage VBAT. This occurs when the supply voltage $V_S$ is less than the target supply voltage $V_{tgt}$. The voltage VSW is brought to VBAT so that the current supplied to the PA 410 by the DC-to-DC converter 460 is not decreasing as quickly (it may or may not be increasing). This will reduce the rate at which the amplifier 430 must source current. Both actions working together to reduce the error in the supply voltage $V_S$ with respect to the target supply voltage $V_{tgt}$.

When the output signal (cmp_h, cmp_m, cmp_l) of the current comparator 440 changes state from 011 to 111, meaning that the amplifier 430 is sourcing current beyond the sourcing threshold, the decoder 450 generates its output signal (etdrv<1:0>) as a 11 to instruct the DC-to-DC converter 460 to generate its output voltage VSW at an auxiliary voltage VAUX higher than the battery voltage VBAT. This occurs when the supply voltage $V_S$ is significantly below the target supply voltage $V_{tgt}$, and the linear amplifier 430 is sourcing current beyond the sourcing current threshold and the voltage VSW is at VAUX so that the current supplied to the PA 410 by the DC-to-DC converter 460 is increasing, both actions working together to increase the supply voltage $V_S$.

When the output signal (cmp_h, cmp_m, cmp_l) of the current comparator 440 changes state from 111 to 011, meaning that the amplifier 430 is sourcing current but not beyond the sourcing threshold and the sourcing current is decreasing, the decoder 450 maintains its output signal (etdrv<1:0>) at 11 to instruct the DC-to-DC converter 460 to maintain its output voltage VSW at VAUX. This occurs when the supply voltage $V_S$ is below the target supply voltage $V_{tgt}$ but is increasing, and the linear amplifier 430 is sourcing current and the voltage VSW is at VAUX so that the current supplied to the PA 410 by the DC-to-DC converter 460 is increasing, both actions working together to increase the supply voltage $V_S$.

When the output signal (cmp_h, cmp_m, cmp_l) of the current comparator 440 changes state from 011 to 001, meaning that the amplifier 430 has stopped sourcing current and is now sinking current, the decoder 450 generates its output signal (etdrv<1:0>) at 01 to instruct the DC-to-DC converter 460 to generate its output voltage VSW at VBAT. This occurs when the supply voltage $V_S$ is greater than the target supply voltage $V_{tgt}$. The voltage VSW is brought to VBAT so that the current supplied to the PA 410 by the DC-to-DC converter 460 is not increasing as quickly (it may or may not be decreasing).

This will reduce the rate at which the amplifier 430 must sink current. Both actions working together to reduce the error in the supply voltage $V_S$ with respect to the target supply voltage $V_{tgt}$.

When the output signal (cmp_h, cmp_m, cmp_l) of the current comparator 440 changes state from 001 to 000, meaning that the amplifier 430 is sinking current beyond the sinking threshold, the decoder 450 generates its output signal (etdrv<1:0>) at 00 to instruct the DC-to-DC converter 460 to generate its output voltage VSW at 0V. This process continues to repeat.

Figure 4D:
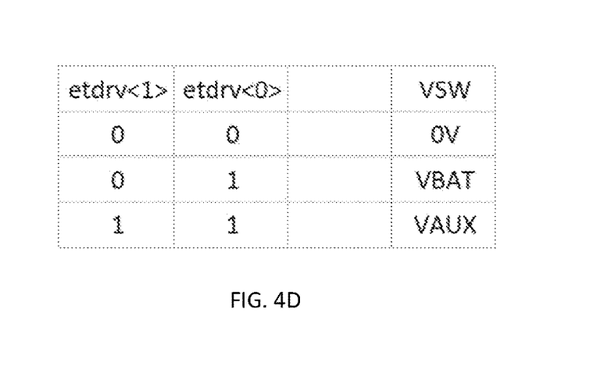
FIG. 4D illustrates another table mapping decoder output to the DC-to-DC converter output voltage in accordance with another aspect of the disclosure.

FIG. 4D illustrates another table that maps the output etdrv<1:0> of the decoder 450 to the output voltage VSW of the DC-to-DC converter 460 in accordance with another aspect of the disclosure. This table just summarizes the description above with respect to mapping the output of the decoder 450 to the output voltage VSW of the DC-to-DC converter 460. That is, when the decoder 450 generates etdrv<1:0> at 00, this instructs the DC-to-DC converter 460 to generate its output voltage VSW at 0V. When the decoder 450 generates etdrv<1:0> at 01, this instructs the DC-to-DC converter 460 to generate its output voltage VSW at VBAT. When the decoder 450 generates etdrv<1:0> at 11, this instructs the DC-to-DC converter 460 to generate its output voltage VSW at VAUX.

Figure 4E:
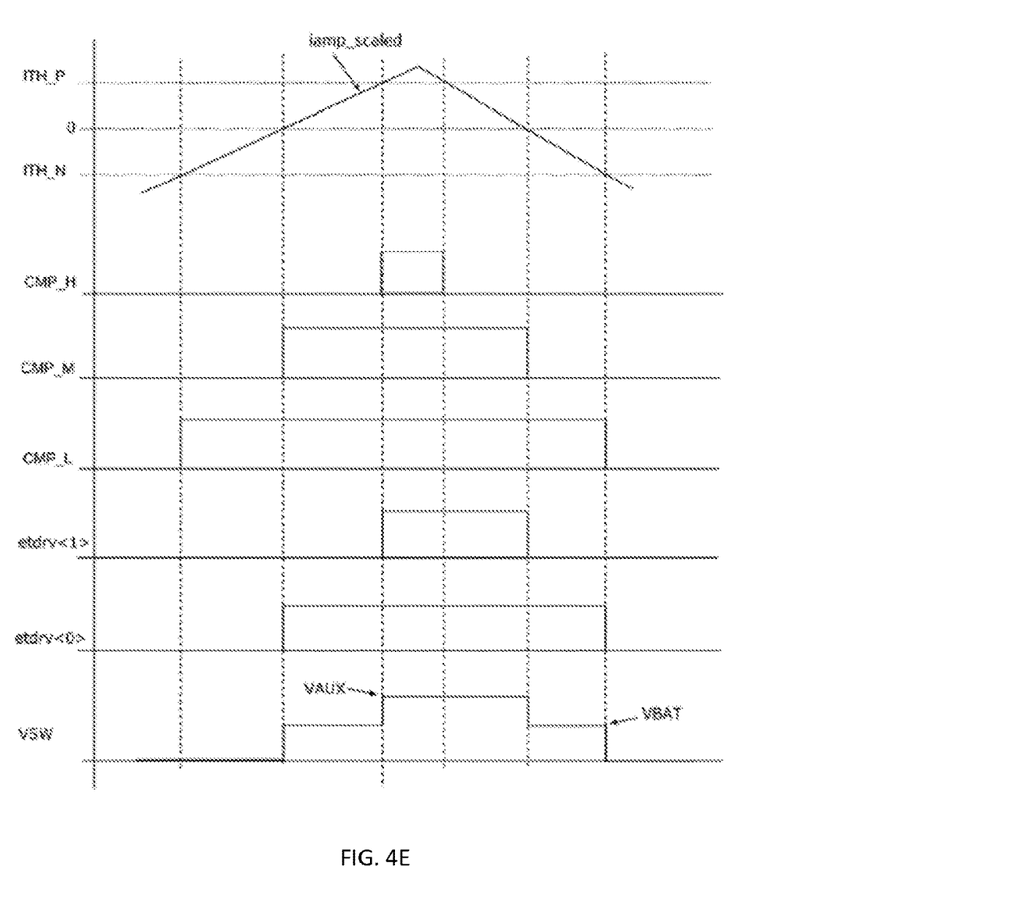
FIG. 4E illustrates a graph of various signals versus time associated with the operation of the voltage control circuit in accordance with another aspect of the disclosure.

FIG. 4E illustrates a graph of the various signals described above versus time associated with the operation of the voltage control circuit 400 in accordance with another aspect of the disclosure. The top portion of the graph illustrates the variation of the sampled amplifier current $I_{amp\_scaled}$ with respect to the positive and negative current thresholds $I_{TH\_P}$ and $I_{TH\_N}$. As discussed above, when the sampled amplifier current $I_{amp\_scaled}$ is above 0 or positive, the amplifier 430 is sourcing current $I_{amp}$ to the upper voltage rail of the PA 410. When the sampled amplifier current $I_{amp\_scaled}$ is below 0 or negative, the amplifier 430 is sinking current $I_{amp}$ away from the upper voltage rail of the PA 410.

The second portion from the top of the graph illustrates the states of the output signal (cmp_h, cmp_m, cmp_l) of the current comparator 440. As discussed, when the output signal of the current comparator 440 is at 000, the amplifier 430 is sinking current beyond the sinking threshold ($I_{TH\_N}$). This is indicated in the first and seventh columns of the graph. When the output signal of the current comparator 440 is at 001, the amplifier 430 is sinking current not beyond the sinking threshold ($I_{TH\_N}$). This is indicated in the second and sixth columns of the graph. When the output signal of the current comparator 440 is at 011, the amplifier 430 is sourcing current not beyond the sourcing threshold ($I_{TH\_P}$). This is indicated in the third and fifth columns of the graph. And, when the output signal of the current comparator 440 is at 111, the amplifier 430 is sourcing current beyond the sourcing threshold ($I_{TH\_P}$). This is indicated in the fourth column of the graph.

The bottom portions of the graph illustrate the states of the output signal etdrv<1:0> of the decoder 450 and the corresponding output voltage VSW of the DC-to-DC converter 460. As discussed, when the amplifier 430 is sinking current beyond the sinking threshold ($I_{TH\_N}$), as indicated in the first and seventh columns of the graph, the output signal etdrv<1:0> of the decoder 450 is at 00 to instruct the DC-to-DC converter 460 to generate its output voltage VSW at 0V. Additionally, when the amplifier 430 is sinking current not beyond the sinking threshold ($I_{TH\_N}$) and the sinking current is decreasing, as indicated in the second column of the graph, the output signal etdrv<1:0> of the decoder 450 is also at 00 to instruct the DC-to-DC converter 460 to maintain its output voltage VSW at 0V.

When the amplifier 430 is sourcing current not beyond the sourcing threshold ($I_{TH\_P}$) and the sourcing current is increasing, as indicated in the third column of the graph, the output signal etdrv<1:0> of the decoder 450 is at 01 to instruct the DC-to-DC converter 460 to maintain its output voltage VSW at VBAT. When the amplifier 430 is sourcing current beyond the sourcing threshold ($I_{TH\_P}$), as indicated in the fourth column of the graph, the output signal etdrv<1:0> of the decoder 450 is at 11 to instruct the DC-to-DC converter 460 to generate its output voltage VSW at VAUX. When the amplifier 430 is sourcing current not beyond the sourcing threshold ($I_{TH\_P}$) and the sourcing current is decreasing, as indicated in the fifth column of the graph, the output signal etdrv<1:0> of the decoder 450 is at 11 to instruct the DC-to-DC converter 460 to maintain its output voltage VSW at VAUX. When the amplifier 430 is sinking current not beyond the sinking threshold ($I_{TH\_N}$) and the sinking current is increasing, as indicated in the sixth column of the graph, the output signal etdrv<1:0> of the decoder 450 is at 01 to instruct the DC-to-DC converter 460 to generate its output voltage VSW at VBAT.

Figure 4F:
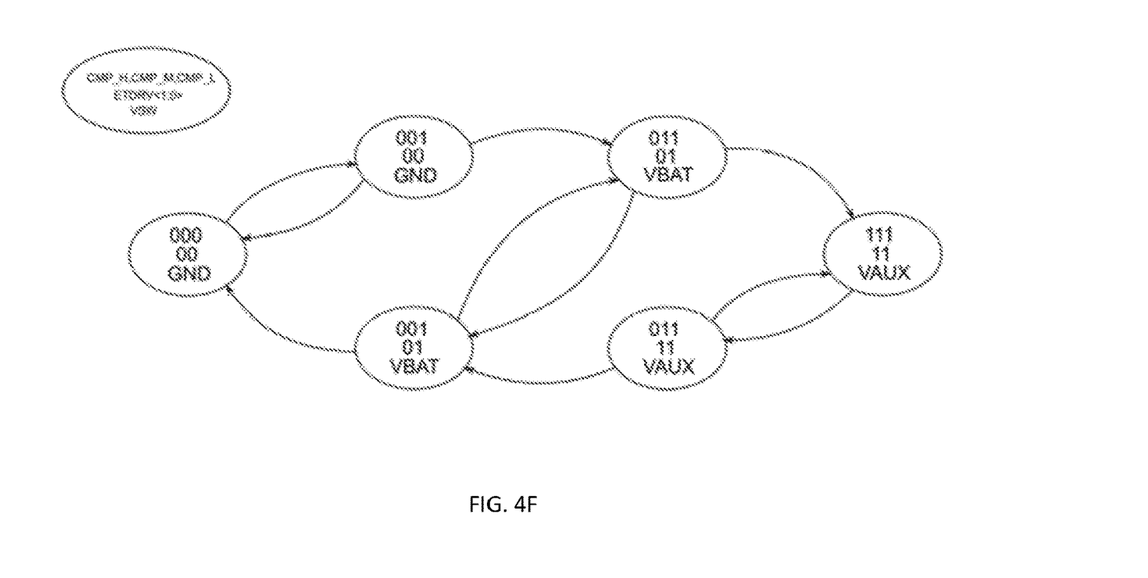
FIG. 4F illustrates a state diagram of various signals associated with the operation of the voltage control circuit in accordance with another aspect of the disclosure.

FIG. 4F illustrates a state diagram of various signals associated with the operation of the voltage control circuit 400 in accordance with another aspect of the disclosure. The state diagram also summarizes the operation discussed above. Each state, represented as an oval, includes three vertically-stacked parameters. The top parameter is the output signal (cmp_h, cmp_m, cmp_l) of the current comparator 440. The middle parameter is the output signal etdrv<1:0> of the decoder 450. And, the bottom parameter is the output voltage VSW of the DC-to-DC converter 460.

The first (left-most oval) state pertains to when the amplifier 430 is sinking current beyond the sinking threshold ($I_{TH\_N}$). In this state, the output signal (cmp_h, cmp_m, cmp_l) of the current comparator 440 is at 000, the output signal etdrv<1:0> of the decoder 450 is at 00, and the output voltage VSW of the DC-to-DC converter 460 is at 0V. From this state, the voltage control circuit 400 enters the state (upper-left oval) where the amplifier 430 is sinking current not beyond the sinking threshold ($I_{TH\_N}$) and the sinking current is decreasing. In such state, the output signal (cmp_h, cmp_m, cmp_l) of the current comparator 440 is at 001, the output signal etdrv<1:0> of the decoder 450 is still at 00, and the output voltage VSW of the DC-to-DC converter 460 is still at 0V.

From this state, the voltage control circuit 400 enters the state (upper-right oval) where the amplifier 430 is sourcing current not beyond the sourcing threshold ($I_{TH\_P}$) and the sourcing current is increasing. In such state, the output signal (cmp_h, cmp_m, cmp_l) of the current comparator 440 is at 011, the output signal etdrv<1:0> of the decoder 450 is at 01, and the output voltage VSW of the DC-to-DC converter 460 is now at VBAT. From this state, the voltage control circuit 400 enters the state (right-most oval) where the amplifier 430 is sourcing current beyond the sourcing threshold ($I_{TH\_P}$). In such state, the output signal (cmp_h, cmp_m, cmp_l) of the current comparator 440 is at 111, the output signal etdrv<1:0> of the decoder 450 is at 11, and the output voltage VSW of the DC-to-DC converter 460 is now at VAUX.

From this state, the voltage control circuit 400 enters the state (lower-right oval) where the amplifier 430 is sourcing current not beyond the sourcing threshold ($I_{TH\_P}$) and the sourcing current is decreasing. In such state, the output signal (cmp_h, cmp_m, cmp_l) of the current comparator 440 is at 011, the output signal etdrv<1:0> of the decoder 450 is still at 11, and the output voltage VSW of the DC-to-DC converter 460 is still at VAUX. From this state, the voltage control circuit 400 enters the state (lower-left oval) where the amplifier 430 is sinking current not beyond the sinking threshold ($I_{TH\_N}$) and the sinking current is increasing. In such state, the output signal (cmp_h, cmp_m, cmp_l) of the current comparator 440 is at 001, the output signal etdrv<1:0> of the decoder 450 is at 01, and the output voltage VSW of the DC-to-DC converter 460 is now at VBAT. From this state, the voltage control circuit 400 enters the first (left-most oval) state and the process repeats.

By varying the control voltage $V_{tgt}/G$ based on the input voltage signal $V_{in}$, the controller 420 is able to change the supply voltage $V_S$ for the PA 410 to track the envelope of the input voltage signal $V_{in}$ or the output voltage signal $V_{out}$, or to vary the supply voltage $V_S$ in any desired manner.

The controller 420 may program the positive and negative current thresholds $I_{TH\_P}$ and $I_{TH\_N}$ via the threshold control signal th_set. The controller 420 may set the positive and negative current thresholds $I_{TH\_P}$ and $I_{TH\_N}$ so they are relatively far apart so that the current generated by the DC-to-DC converter 460 ramps slowly to reduce noise in the supply voltage $V_S$ at the cost of losing power efficiency. Conversely, the controller 420 may set the positive and negative current thresholds $I_{TH\_P}$ and $I_{TH\_N}$ relatively close to each other so that the current generated by the DC-to-DC converter 460 ramps faster to improve power efficiency while increasing noise in the supply voltage $V_S$. Accordingly, the threshold control signal th_set may be set to achieve the desired tradeoff between power efficiency and noise in the supply voltage $V_S$.

Figure 5:
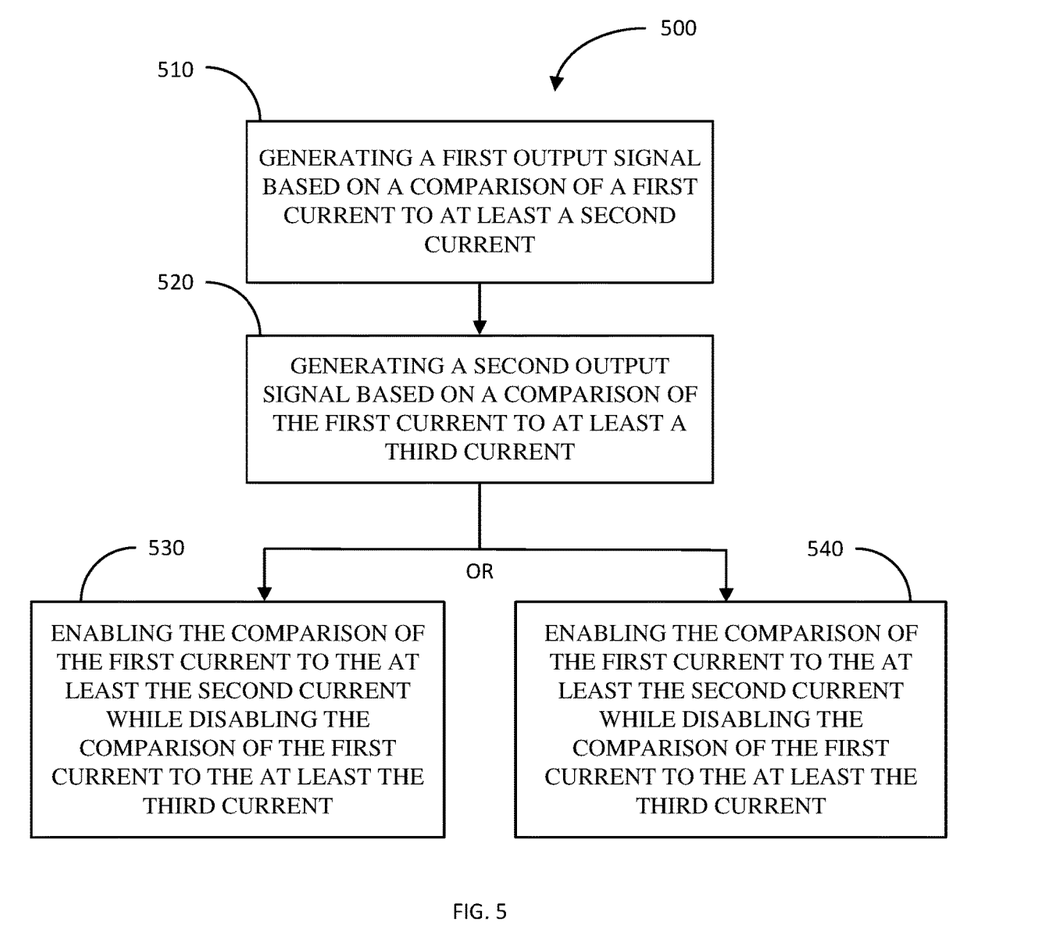
FIG. 5 illustrates a flow diagram of an exemplary method of comparing an input current to a set of current thresholds in accordance with another aspect of the disclosure.

FIG. 5 illustrates a flow diagram of an exemplary method 500 of comparing an input current (e.g., a first current) to a set of current thresholds (e.g., second and third currents) in accordance with another aspect of the disclosure.

The method 500 includes generating a first output signal based on a comparison of a first current to at least a second current (block 510). An example of means for generating a first output signal based on a comparison of a first current to at least a second current include comparator CMP1 of current comparator 200 or 440.

The method 500 further includes generating a second output signal based on a comparison of the first current to at least a third current (block 520). An example of means for generating a second output signal based on a comparison of the first current to at least a third current include comparator CMP3 of current comparator 200 or 440.

The method 500 further includes enabling the comparison of the first current to the at least the second current while disabling the comparison of the first current to the at least the third current (block 530). An example of means for enabling the means for comparing the first current to the at least the second current while disabling the means for comparing the first current to the at least the third current include the comparator CMP2, inverter I, and transistor M1 configured on and transistor M2 configured off.

Or, the method 500 includes enabling the comparison of the first current to the at least the third current while disabling the comparison of the first current to the at least the second current (block 540). An example of means for enabling the means for comparing the first current to the at least the third current while disabling the means for comparing the first current to the at least the second current include the comparator CMP2, inverter I, and transistor M1 configured off and transistor M2 configured on.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a first comparator having a first input to receive an input signal, a second input to receive a reference signal, and an output;
a set of one or more switches having an input coupled to the output of the first comparator, wherein the set of one or more switches operate in response to a first output signal from the first comparator to select a threshold current out of a set of one or more threshold currents; and
a second comparator to generate a second output signal based on a comparison of the input signal against the selected threshold current corresponding to the first output signal being at a first state.

2. The apparatus of claim 1, further comprising a third comparator to generate a third output signal based on a comparison of the input signal against the selected threshold current corresponding to the first output signal being at a second state.

3. The apparatus of claim 1, wherein the set of one or more switches comprises a n-channel metal oxide semiconductor field effect transistor (NMOS), wherein the set of one or more switches comprises a p-channel metal oxide semiconductor field effect transistor (PMOS), or wherein the set of one or more switches comprises an NMOS and a PMOS.

4. The apparatus of claim 3, further comprising:
a current source to generate one of the set of one or more threshold currents; and
a first current sink to sink another of the set of one or more threshold currents;
wherein the current source, the NMOS, the PMOS, and the first current sink are coupled in series between an upper voltage rail and a lower voltage rail, wherein the first input of the first comparator is coupled to a node between the NMOS and the PMOS, and wherein gates of the NMOS and PMOS is coupled to the output of the first comparator.

5. The apparatus of claim 4, further comprising a second current sink to sink yet another of the set of one or more threshold currents, wherein the second current sink is coupled between the first input of the first comparator and the lower voltage rail.

6. The apparatus of claim 1, further comprising a current source to generate one of the set of one or more threshold currents.

7. The apparatus of claim 1, further comprising a current sink to sink one of the set of one or more threshold currents.

8. The apparatus of claim 1, wherein the input signal comprises an input current.

9. The apparatus of claim 1, further comprising current devices to generate three threshold currents of the set against which the input signal is compared.

10. An apparatus, comprising:
a first comparator having a first input to receive an input signal, a second input to receive a reference signal, and an output;
a current source to provide a first threshold current;
a first current sink to provide a second threshold current;
a second current sink to provide a third threshold current;
a set of one or more switches coupled between the current source and the first and the second current sinks, the set of one or more switches having an input coupled to the output of the first comparator; and
a second comparator to compare the input signal against a difference between the second and first threshold currents.

11. The apparatus of claim 10, wherein the set of one or more switches comprises a n-channel metal oxide semiconductor field effect transistor (NMOS) and a p-channel metal oxide semiconductor field effect transistor (PMOS).

12. The apparatus of claim 11, wherein the current source, the NMOS, the PMOS, and the first current sink are coupled in series between an upper voltage rail and a lower voltage rail, wherein the first input of the first comparator is coupled to a node between the NMOS and the PMOS, and wherein gates of the NMOS and PMOS is coupled to the output of the first comparator.

13. The apparatus of claim 12, wherein the second current sink is coupled between the first input of the first comparator and the lower voltage rail.

14. The apparatus of claim 10, further comprising a third comparator to compare the input signal against a sum of the first and second threshold currents.

15. An apparatus, comprising:
a first comparator having a first input to receive an input signal, a second input to receive a reference signal, and an output;
a current source to provide a first threshold current;
a first current sink to provide a second threshold current;
a second current sink to provide a third threshold current;
a set of one or more switches coupled between the current source and the first and the second current sinks, the set of one or more switches having an input coupled to the output of the first comparator; and
a second comparator configured to compare the input signal against a sum of the first and second threshold currents.

16. An apparatus, comprising:
a current source;
a first switching device;
a second switching device;
a first current sink, wherein the current source, the first switching device, the second switching device, and the first current sink are coupled in series between first and second voltage rails;
a first comparator including a first input coupled to a node between the current source and the first switching device, and a second input to receive a reference signal;
a second comparator including a first input coupled to a node between the second switching device and the first current sink, and a second input to receive the reference signal; and
a third comparator including a first input to receive an input signal and coupled to a node between the first and second switching devices, a second input to receive the reference signal, and an output coupled to control inputs of the first and second switching devices.

17. The apparatus of claim 16, further comprising a second current sink coupled between the first input of the third comparator and the second voltage rail.

18. The apparatus of claim 16, wherein the first and second switching devices each comprise a field effect transistor (FET).

* * * * *